United States Patent [19]

Bergemont

[11] Patent Number: 5,212,541
[45] Date of Patent: May 18, 1993

[54] CONTACTLESS, 5V, HIGH SPEED EPROM/FLASH EPROM ARRAY UTILIZING CELLS PROGRAMMED USING SOURCE SIDE INJECTION

[75] Inventor: Albert M. Bergemont, San Jose, Calif.
[73] Assignee: National Semiconductor Corporation
[21] Appl. No.: 687,281
[22] Filed: Apr. 18, 1991
[51] Int. Cl.$^5$ ............................................. H01L 29/68
[52] U.S. Cl. ................................... 257/319; 365/185; 257/202
[58] Field of Search ...................... 357/23.5, 23.3, 45; 365/185

[56] References Cited

U.S. PATENT DOCUMENTS

| | | | |
|---|---|---|---|
| 4,794,565 | 12/1988 | Wu et al. | 365/185 |
| 4,967,393 | 10/1990 | Yokoyama et al. | 357/23.5 |
| 5,023,680 | 6/1991 | Gill et al. | 357/23.5 |
| 5,036,378 | 7/1991 | Lu et al. | 357/23.5 |
| 5,060,195 | 10/1991 | Gill et al. | 357/23.5 |

OTHER PUBLICATIONS

M. Gill et al.; A 5 Volt Contactless Array 256K Bit Flash EEPROM Technology; Texas Instruments Inc.

*Primary Examiner*—Andrew J. James
*Assistant Examiner*—Sara W. Crane
*Attorney, Agent, or Firm*—Limbach & Limbach

[57] ABSTRACT

The present invention provides a 5V only, EPROM memory cell structure that is utilizable in high speed UV-erasable or flash EPROM contactless arrays and that uses source side injection for programming. The EPROM cell structure comprises spaced-apart N-type source and drain regions that define a channel region in a P-type substrate. A first layer of insulating material overlies the channel region. A polysilicon (poly 1) floating gate is formed on the first insulating layer and overlies a first portion of the channel region that extends from the drain region to a point in the channel region intermediate the source and drain regions thereby defining a second portion of the channel region that extends from the intermediate point to the source region and over which the floating gate does not extend. The poly 1 floating gate also includes a coupling portion that extends over the field oxide that defines the active device area in which the EPROM cell is formed. A second layer of insulating material is formed over the floating gate, including the coupling portion of the floating gate. A polysilicon (poly 2) control gate overlies the floating gate but is separated therefrom by the second insulating layer. The poly 2 control gate includes an access portion that overlies the second portion of the channel region but is separated therefrom by the first layer of insulating material. A polysilicon (poly 2) coupling line overlies the coupling portion of the floating gate but is separated therefrom by the second insulating layer. This cell structure is utilized in a contactless array that relies on shared source lines, resulting in very small cell size and relatively simple decoding.

5 Claims, 4 Drawing Sheets

CONTACTLESS, 5V, HIGH SPEED EPROM/FLASH EPROM ARRAY UTILIZING CELLS PROGRAMMED USING SOURCE SIDE INJECTION

BACKGROUND OF THE INVENTION

1. Field of the Invention

The present invention relates to electrically programmable read only memory (EPROM) devices and, in particular, to a unique contactless 5V-only EPROM array that utilizes cells that rely on source side injection for programming.

2. Discussion of the Prior Art

An electrically programmable read only memory (EPROM) device is a non-volatile memory integrated circuit which is used to store binary data. Power can be removed from an EPROM without loss of data. That is, upon reapplying power, the originally-stored binary data is retained.

In addition to its data retention capability, an EPROM can also be reprogrammed to store new binary data. Reprogramming is accomplished by first exposing the EPROM to an ultra-violet (UV) light source in order to erase the old binary data. A UV-transparent lid on the packaged EPROM chip allows this erasure to occur. Following erasure, the new binary data is written into the EPROM by deactivating the chip select line in order to switch the EPROM's data outputs to inputs. The EPROM address inputs are then set to a starting value, the desired data is connected to the data inputs and the data is written into the data storage register identified by the address inputs. The address inputs are then incremented and the cycle is repeated for each data storage register in the EPROM array.

In an EPROM read operation, the binary data stored in the data storage register identified at the address inputs is connected to the chip's data output buffers. If the EPROM's chip select signal is activated, then the binary data from the selected storage register is provided to the data bus.

An electrically erasable programmable read only memory (EEPROM) is a variation in EPROM design wherein binary data is read, written and erased electrically. A single operation erases the selected data storage register. In the case of a so-called "flash" EPROM, all data storage registers in the memory array are electrically erased in a single operation.

A conventional EPROM cell includes buried N+source and drain regions formed in a P-type silicon substrate and separated by a substrate channel region. A polysilicon floating gate (poly 1) is formed on a dielectric layer, usually silicon dioxide, overlying the channel region. A polysilicon control gate (poly 2) is formed over the poly 1 floating gate and is separated therefrom by insulating material, typically an oxide-nitrideoxide (ONO) composite.

The logic state of the above-described cell, i.e, whether it is storing a "1" or a "0", is determined by the charge on the poly 1 floating gate. When electrons are placed on the floating gate, the threshold voltage required to turn on the cell by applying a potential to the poly 2 control gate is much greater than when no electrons are placed on the floating gate.

U.S. Pat. No. 4,794,565, issued Dec. 27, 1988 to Wu et al, discloses the concept of a source-side injection EPROM cell. The Wu et al cell provides for the improved efficiency of hot electron injection from the source to the floating gate during programming. The Wu et al cell includes the conventional N+ source and drain regions formed in a P-type silicon substrate to define a substrate channel. A poly 2 control gate overlies the channel region and a poly i floating gate, insulated from the control gate and from the source and drain regions, is located beneath the control gate. A weak gate control region, or access transistor, is provided near the source region so that a relatively high channel electric field is created in the region between the weak control gate and the floating gate for promoting hot electron injection from the source to the floating gate when the cell is biased for programming.

Since a low current approach to programming eliminates the need for the external high voltage source usually required for EPROM cells, the high voltage being generated from an internal 5V supply, high speed, 5V only, UV-erasable and flash EPROMs are becoming of greater interest, particularly for use in programmable logic devices. However, only a few 5V EPROM products are presently described in the literature.

Gill et al, "A 5 Volt Contactless Array 256K Bit Flash EEPROM Technology", describe a contactless EPROM cell for a single power supply 5V flash EEPROM. The cell utilizes buried N+ source and drain regions. The oxide between the cell's floating gate and the substrate near the source is 100Å thick for programming the cell via hot-electron injection and for erasing the cell via Fowler-Nordheim tunneling. Because of the low current requirements for programming and erase, the programming voltage Vpp can be generated internally from a 5V supply. A gate oxide near the tunnel window is 250Å thick to improve source junction field plate breakdown voltage. The pass gate, which utilizes a 500Å thick gate oxide, prevents the cell from drawing current even when the floating gate structure is over-erased into depletion. The buried N+ source and drain regions of the cell constitute the continuous buried bit lines.

The Gill et al cell, however, requires a very complicated process for fabrication.

Naruke et al, "A New Flash-Erase EEPROM Cell With A Sidewall Select-Gate On Its Source Side", IEDM 1986, describe a flash EPROM cell that also features 5V-only programming. The cell, shown in FIGS. 2A–2C, consists of a triple polysilicon, stacked-gate MOS transistor with a side-wall polysilicon select gate spacer on the source side.

As shown in FIG. 1A, because of the high field, high gate current of the Naruke et al cell at the spacer-to-stack interface when programming, the use of more than 5V on the drain side can be avoided.

FIG. 1B shows the typical operating voltages of the Naruke et al cell in the read mode. Since the cell is free of turn-on, i.e. the access spacer transistor prevents the other cells on the same bit line from being leaky during programming, there is no need for a punch-through implant in the memory cell. This increases the mobility value and, thus, increases the read current. From another point of view, putting 5V on the poly spacer in the read mode inverts the silicon under the spacer, leading to an effective channel length Leff equal to the length of the poly 1 floating gate. This leads to high read current and, thus, small read access time.

FIG. 1C shows typical operating voltages of the Naruke et al cell in the erase mode. Erase occurs through Fowler-Nordheim tunneling across the thin gate oxide (100Å) at the drain edge. As shown in FIG. 1C, the drain of the cell is graded to increase gate induced breakdown voltage.

The Naruke et all cell is a complicated device to manufacture because of the triple-poly process required to fabricate the access transistor spacer. Furthermore, it relies on a T-shaped cell design that utilizes one contact for every two cells, thus consuming valuable die area. In addition, the spacer extends along the entire length of the word line, creating potential fabrication problems relating to spacer resistance and continuity.

Van Houdt et al, "Study of the enhanced hotelectron injection in split-gate transistor structures", a paper presented at ESSDERC 90, Nottingham, Sep. 1990, Session 3C5, disclose a double-poly, split-gate cell structure which, they suggest, can be used in a 5V-only EPROM or flash-EPROM array. However, the Van Houdt et al cell is not disclosed as utilizable in a contactless EPROM array.

SUMMARY OF THE INVENTION

The present invention provides a contactless, 5V only, EPROM memory cell structure that is utilizable in high speed UV-erasable or flash EPROM contactless arrays and that uses source side injection for programming.

The EPROM cell structure comprises spaced-apart N-type source and drain regions that define a channel region in a P-type substrate. A first layer of insulating material overlies the channel region. A polysilicon (poly 1) floating gate is formed on the first silicon dioxide layer and overlies a first portion of the channel region that extends from the drain region to a point in the channel region intermediate the source and drain regions thereby defining a second portion of the channel region that extends from the intermediate point to the source region and over which the floating gate does not extend. The floating gate also includes a coupling portion that extends over the field oxide that defines the active device area in which the EPROM cell is formed. A second insulating layer is formed over the floating gate, including the coupling portion of the floating gate. A polysilicon (poly 2) control gate overlies the floating gate but is separated therefrom by the second insulating layer. The control gate includes an access portion that overlies the second portion of the channel region but is separated therefrom by the first layer of insulating material. A polysilicon coupling line overlies the coupling portion of the floating gate but is separated therefrom by the second insulating layer. The above-described cell structure is utilized in a "contactless" array, i.e., an array that relies on shared source lines (contacted every 32, 48 or 643cells), resulting in a very small cell size and simple decoding.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1A:
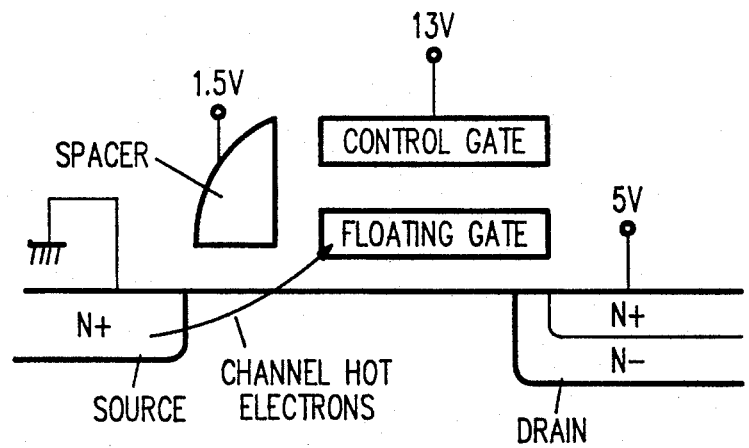
FIG. 1A is a cross-sectional view illustrating a flash-EPROM cell with side-wall select gate transistor in the programming mode.
Figure 1B:
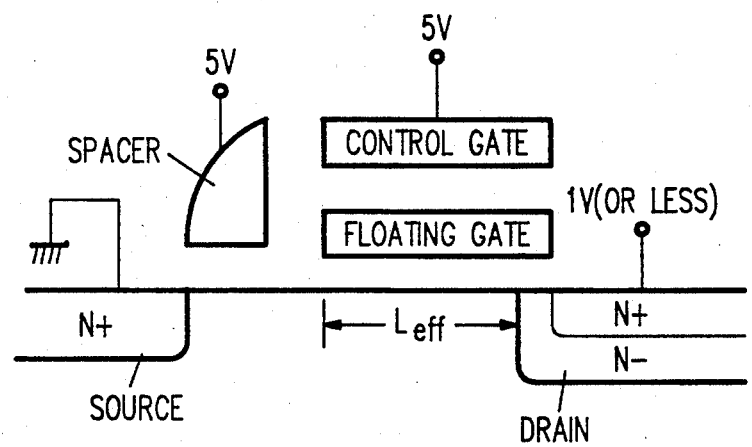
FIG. 1B is a cross-sectional view illustrating the FIG. 1A cell in the red mode.
Figure 1C:
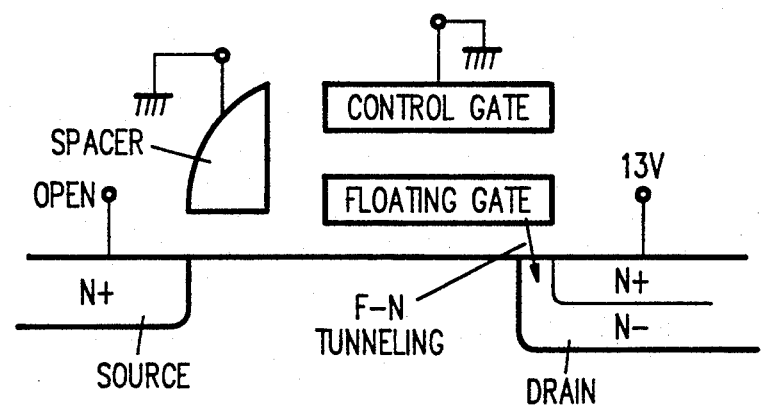
FIG. 1C is a cross-section view illustrating the FIG. 1A cell in the erase mode.
Figure 2:
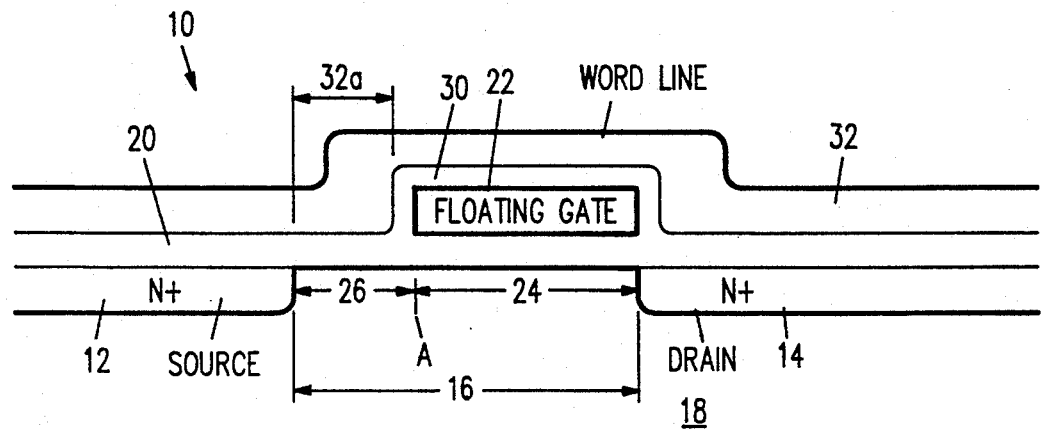
FIG. 2 is a cross-sectional view illustrating a contactless EPROM cell in accordance with the present invention.
Figure 3:
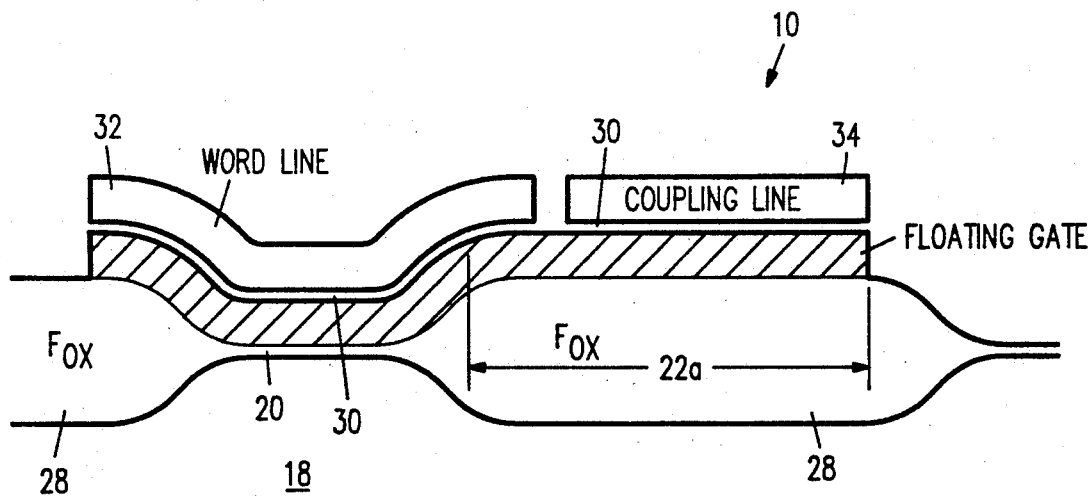
FIG. 3 is a cross-sectional view illustrating the coupling line of the FIG. 2 contactless EPROM cell.

FIGS. 2 and 3 provide cross-sectional views of a "contactless", 5V-only, EPROM memory cell 10 in accordance with the present invention that is utilizable in a UV-erasable or flash EPROM array. The contactless EPROM cell 10 uses the same access transistor concept described above in the background section of this document to increase the field in one region of the channel and also utilizes source side injection for programming. However, unlike the Naruke et al EPROM cell described above, the access transistor of the contactless EPROM cell 10 does not use a polysilicon spacer. Rather, as described in greater detail below, the access transistor is one part of the word line which directly controls the channel region. Furthermore, unlike the Van Houdt et al cell described above, the EPROM cell 10 is "contactless", contacting the bit line only every 32, 48 or 64 cells, for example.

As shown in FIGS. 2 and 3, the EPROM cell 10 comprises spaced-apart N-type source and drain regions 12 and 14, respectively, that define a channel region 16 in a P-type semiconductor substrate 18. A first layer 20 of silicon dioxide overlies the channel region 16. A polysilicon (poly 1) floating gate 22 is formed on the first silicon dioxide layer 20 and overlies a first portion 24 of the channel region 16 that extends from the drain region 14 to a point A in the channel region 16 intermediate the source and drain regions 12 and 14, respectively. Thus, the poly 1 floating gate 22 defines a second portion 26 of the channel region 16 that extends from the intermediate point A to the source region 12 and over which the floating gate 22 does not extend. As best shown in FIG. 3, the floating gate 22 also includes a coupling portion 22a that extends over the field oxide 28 that defines the active device area in which the EPROM cell 10 is formed. A second layer 30 of insulating material, e.g., silicon dioxide, is formed over the floating gate 22. The second layer 30 of silicon dioxide extends over the coupling portion 22a of a floating gate 22.

A polysilicon (poly 2) control gate 32, which serves as the word line of the cell 10, overlies the poly 1 floating gate 22 but is separated from the floating gate 22 by the second silicon dioxide layer 30. The poly 2 control gate 32 includes an access portion 32a that overlies the second portion 26 of the channel region 16 but is separated from the second portion 26 of the channel region 16 by the first silicon dioxide layer 20. A polysilicon (poly 2) coupling line 34 overlies the coupling portion 22a of the floating gate 22 but is separated therefrom by the second silicon dioxide layer 30.

Figure 4A:
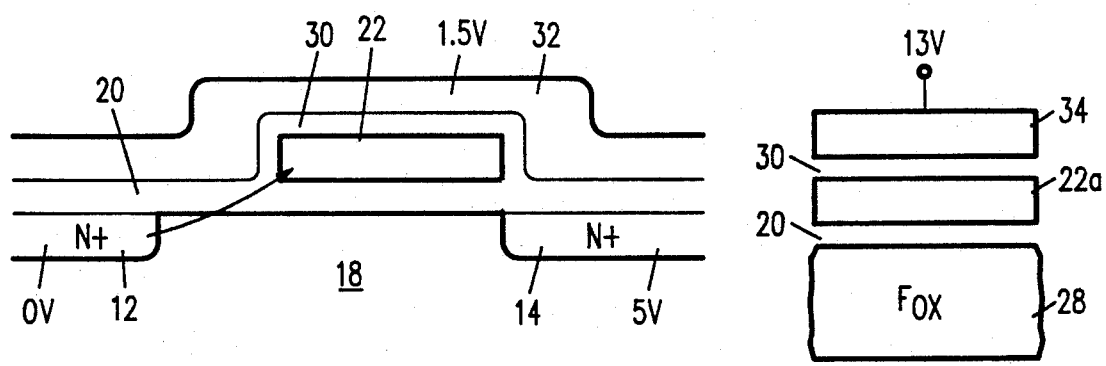
FIG. 4A is a cross-sectional view illustrating the FIG. 2 cell, utilized in an EPROM, in the programming mode.

As shown in FIG. 4A, in order to write the cell 10, the word line 32 is held at low voltage, i.e. 1.5V, source 12 at $V_{ss}$ and the drain 14 at 5V. To force the floating gate 22 high (i.e. 8-9 volts), the floating gate 22 is coupled in the other direction by the poly 2 coupling line 34 (at 10-13 volts) which crosses the poly 2 coupling portion 22a of the floating gate 22 over the field oxide 28.

Figure 4B:
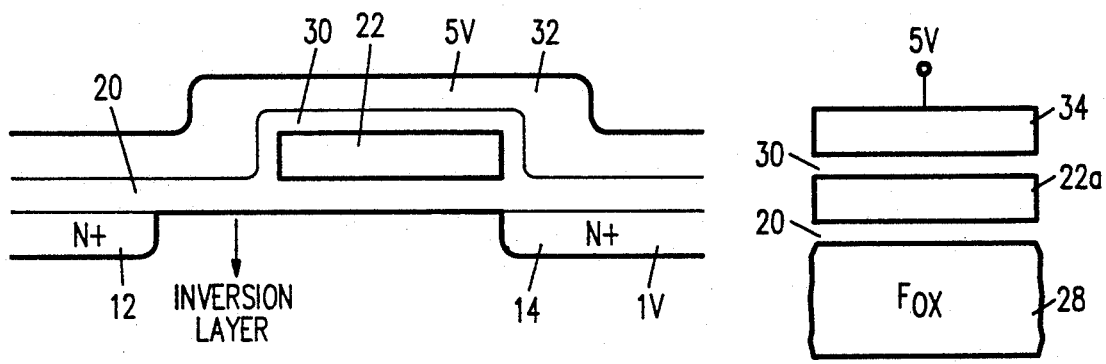
FIG. 4B is a cross-sectional view illustrating the FIG. 2 cell, utilized in an EPROM, in the read mode.
Figure 5:
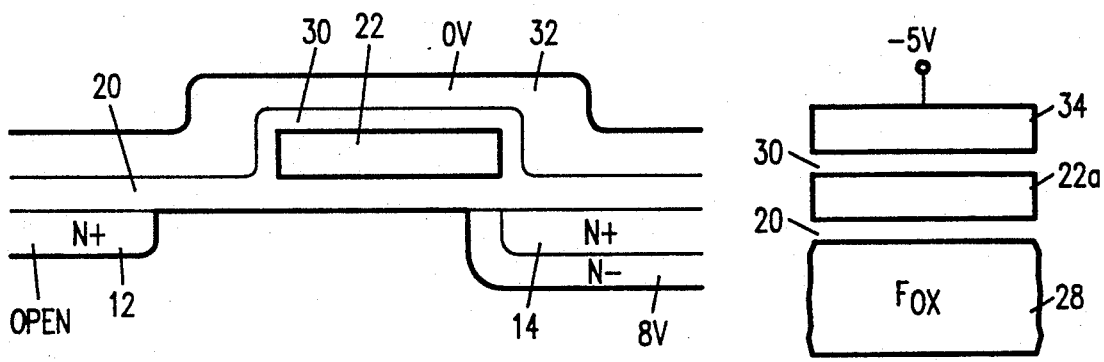
FIG. 5 is a cross-sectional view illustrating the FIG. 2 cell, utilized in a flash-EPROM, in the erase mode.

FIG. 4B shows typical operating voltages for cell 10, as utilized in a UV-erasable EPROM array, in the read mode. The erasing of the cell 10 is accomplished by UV exposure if utilized in an EPROM array or, as shown in FIG. 5, by placing a negative voltage on the coupling line 34 (for example, −5V), a positive voltage (5-8V) on the drain 14 and maintaining the source 12 open and the word line 32 to $V_{ss}$ if erase is electrically performed, as in a flash EPROM array.

If the above-described EPROM cell 10 is used in a flash EPROM array, then the typical operating voltages for both a programming and read operation are identical to those described above for the UV erasable application.

Figure 6:
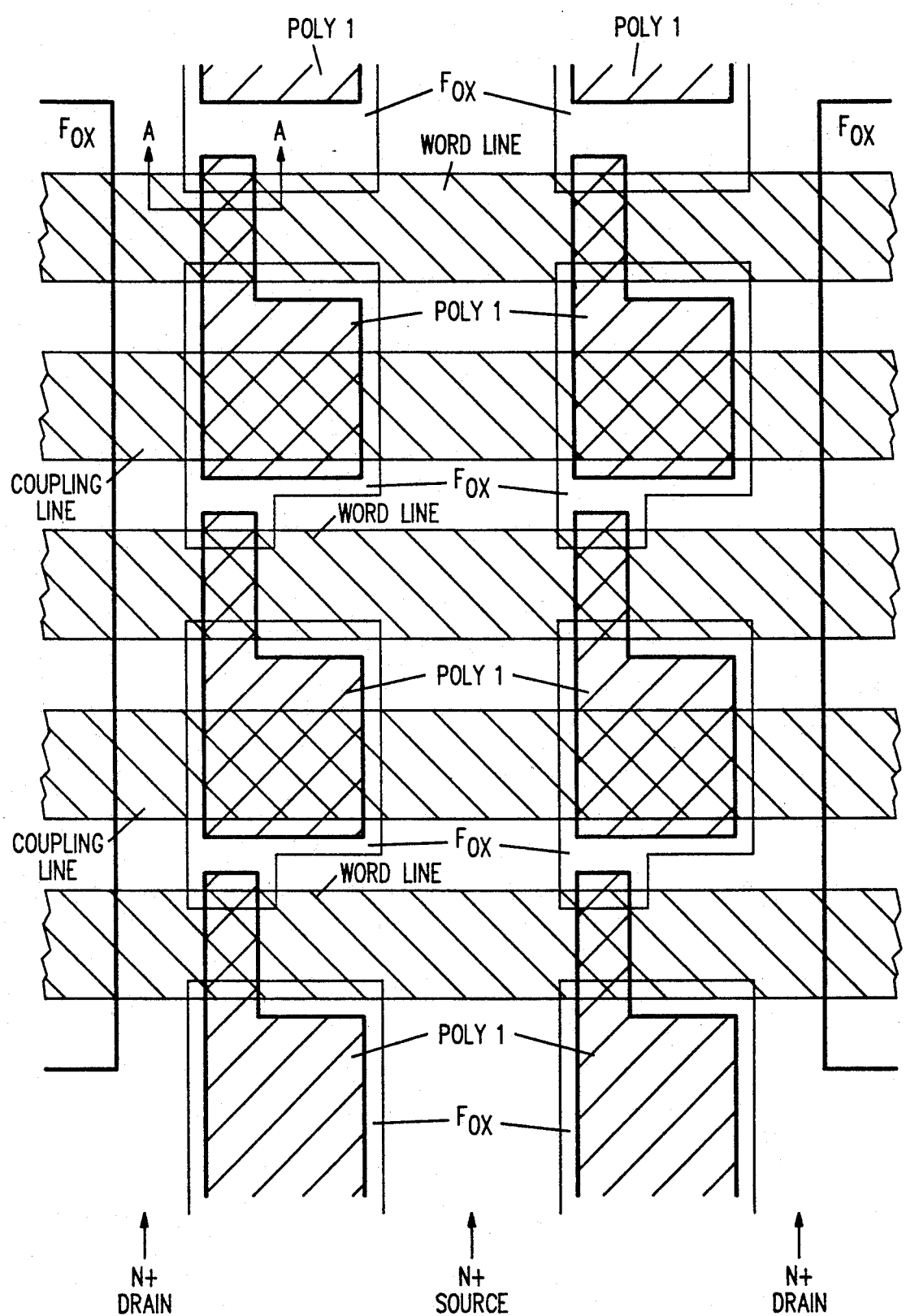
FIG. 6 is a plan view illustrating the layout of the FIG. 2 cell.

Referring to FIG. 6, one of the key points of the cell structure is the cell layout in an array. The typical T-shape cell, such as that described in the background section of the invention, is difficult to use because, in that configuration, one of the main areas of the cell is taken by the drain contact adjacent to each cell. FIG. 6 illustrates the new cell 10 in a contactless array. Assuming a 1 μ drain geometry, a T-shaped layout of the cell 10 would lead to a 66μ² cell. The layout illustrated in FIG. 6, which reduces the cell size by utilizing a contactless layout, utilizing the same 1μ design, leads to a 20μ² cell.

As shown in FIG. 6, and as stated above, an EPROM cell within the illustrated array does not share one contact with two cells, as is the case in conventional EPROM arrays, but rather has its source line contacted every 32, 48 or 64 cells.

As further shown in FIG. 6, two adjacent cells within the illustrated array share the same N+ source line and are separated from other cells in the array along the same poly 2 word line by field oxide (Fox). The poly 2 coupling line described above parallels the word line in each cell to provide capacitive coupling to that portion of the underlying poly 1 floating gate that extends over the inter-array field oxide.

An EPROM array having a similar layout is described in co-pending U.S. Pat. application Ser. No. 687,105 for NEW CONTACTLESS FLASH EPROM CELL using A STANDARD ROW DECODER which was filed by A. Bergemont on the same date as this application, and which is commonly assigned to National Semiconductor Corporation; the just-referenced Bergemont application is hereby incorporated by reference to provide additional background for the present invention.

Thus, the new cell, utilizable in either a flash or EPROM array, uses source side injection without a spacer. Eliminating the spacer makes the technology much simpler to fabricate, perhaps at the expense of manufacturing a larger cell. Use of the word line brings the low voltage to the part of the poly over the source. The high voltage control gate is achieved through coupling the floating gate with a special coupling poly 2 line.

The cell uses a shared-line source to reduce the cell size. Again, 5V-only programming is required. Thus, this cell is ideal for use in programmable logic devices.

It should be understood that various alternatives to the embodiment of the invention described herein may be employed in practicing the invention. It is intended that the following claims define the scope of the invention and that structures and methods within the scope of these claims and their equivalents be covered thereby.

What is claimed is:

1. A contactless, 5V only EPROM cell array formed in a silicon substrate, the EPROM cell array comprising:
   (a) an N+ source line formed in the silicon substrate;
   (b) first and second N+drain lines formed in parallel with and spaced-apart from the source line on opposite sides of the source line to define respective first and second substrate channel regions therebetween;
   (c) first and second field oxide strips formed in parallel with and spaced-apart from the first and second drain lines, respectively, such that the source line/drain line structure is isolated by the first and second field oxide strips to separate such structure from adjacent similar source/drain structures in the array;
   (d) a layer of first insulating material formed over the channel regions;
   (e) first and second array field oxide regions formed in the substrate between the first drain line and the source line and the second drain line and the source line, respectively;
   (f) first and second floating gates formed on the first insulating material and overlying a first portion of the corresponding first and second channel regions, respectively, that extends from an edge of the corresponding drain region to an intermediate point of the channel region thereby defining a second portion at the channel region that extends from the intermediate point to an edge of the source line and over which the floating gate does not extend, the floating gate including a coupling portion that extends over the corresponding array field oxide region;
   (g) a layer of second insulating material formed over the first and second floating gates, including the coupling portion thereof;
   (h) a conductive control gate line overlying the first and second floating gates but separated therefrom by the layer of second insulating material and comprising first and second access portions overlying the second portion of the first and second channel regions, respectively, but separated therefrom by the layer of first insulating material; and
   (i) a conductive coupling line overlying the coupling portion of the first and second floating gates but separated therefrom by the layer of second insulating material.

2. An EPROM cell array as in claim 1 wherein the first insulating material is silicon dioxide.

3. An EPROM cell array as in claim 2 wherein the first and second floating gates comprise polycrystalline silicon.

4. An EPROM cell array as in claim 3 wherein the second insulating material comprises a composite layer of oxide-nitride-oxide (ONO).

5. An EPROM cell array as in claim 4 wherein both the control gate and the coupling line comprise polycrystalline silicon.

* * * * *